United States Patent
Li

(10) Patent No.: US 11,600,706 B2
(45) Date of Patent: Mar. 7, 2023

(54) COMPOSITE SUBSTRATE AND MANUFACTURING METHOD THEREOF

(71) Applicant: WAFER WORKS CORPORATION, Taoyuan (TW)

(72) Inventor: Wen-Chung Li, Taoyuan (TW)

(73) Assignee: WAFER WORKS CORPORATION, Taoyuan (TW)

( * ) Notice: Subject to any disclaimer, the term of this patent is extended or adjusted under 35 U.S.C. 154(b) by 0 days.

(21) Appl. No.: 17/447,291

(22) Filed: Sep. 10, 2021

(65) Prior Publication Data
US 2022/0393003 A1 Dec. 8, 2022

(30) Foreign Application Priority Data
Jun. 8, 2021 (TW) .................. 110120839

(51) Int. Cl.
*H01L 29/267* (2006.01)
*H01L 21/02* (2006.01)

(52) U.S. Cl.
CPC ...... *H01L 29/267* (2013.01); *H01L 21/02658* (2013.01); *H01L 21/02694* (2013.01)

(58) Field of Classification Search
None
See application file for complete search history.

(56) References Cited

U.S. PATENT DOCUMENTS

| | | | |
|---|---|---|---|
| 7,084,046 B2 * | 8/2006 | Mitani | H01L 21/76254 438/459 |
| 7,579,259 B2 | 8/2009 | Fournel et al. | |
| 9,997,353 B1 * | 6/2018 | Kumar | H01L 21/02422 |
| 2005/0020036 A1 * | 1/2005 | Sai | H01L 21/02521 257/E21.12 |
| 2006/0011916 A1 * | 1/2006 | Sakai | H01L 21/02532 257/E21.093 |
| 2007/0141803 A1 * | 6/2007 | Boussagol | C30B 33/00 438/455 |
| 2017/0062267 A1 * | 3/2017 | Koga | H01L 21/02164 |
| 2018/0315820 A1 * | 11/2018 | Kub | H01L 29/66916 |

FOREIGN PATENT DOCUMENTS

| | | |
|---|---|---|
| TW | 201241994 A | 10/2012 |
| TW | 201635521 A | 10/2016 |
| TW | 201738415 A | 11/2017 |
| TW | 201840920 A | 11/2018 |
| WO | 2020/137501 A1 | 7/2020 |

* cited by examiner

*Primary Examiner* — Alexander G Ghyka
(74) *Attorney, Agent, or Firm* — CKC & Partners Co., LLC

(57) ABSTRACT

A composite substrate is provided in some embodiments of the present disclosure, which includes a substrate, an insulation layer, a first silicon-containing layer and a first epitaxial layer. The insulation layer is disposed on the substrate. The first silicon-containing layer is disposed on the insulation layer, in which the first silicon-containing layer includes a plurality of group V atoms. The first epitaxial layer is disposed on the first silicon-containing layer, in which the first epitaxial layer includes a plurality of group III atoms. A distribution concentration of the group V atoms in the first silicon-containing layer increases as getting closer to the first epitaxial layer, and a distribution concentration of the group III atoms in the first epitaxial layer increases as getting closer to the first silicon-containing layer. A method of manufacturing a composite substrate is also provided in some embodiments of the present disclosure.

6 Claims, 10 Drawing Sheets

COMPOSITE SUBSTRATE AND MANUFACTURING METHOD THEREOF

CROSS-REFERENCE TO RELATED APPLICATION

This application claims priority to Taiwan Application Serial Number 110120839, filed Jun. 8, 2021, which is herein incorporated by reference.

BACKGROUND

Field of Invention

The present disclosure relates to a composite substrate and a manufacturing method thereof.

Description of Related Art 5G applications have been at a stage of vigorous development in recent years. Nowadays, almost all the composite substrates used for manufacturing high-frequency components (gallium nitride) have a high resistance value (resistance value>kiloohm-cm (kΩ-cm)). This is because when the component is operated, a crosstalk effect will be generated by the carriers in the low-resistance composite substrate, which in turn will interfere with signal transmission.

However, the high-resistance composite substrate has a lower mechanical strength and tends to warp and crack after epitaxy, so that a thicker epitaxial layer can not be grown. In addition, the cost of the high-resistance composite substrate is higher.

For the foregoing reasons, there is a need to solve the above-mentioned problems by providing a composite substrate and a manufacturing method thereof.

SUMMARY

One aspect of an embodiment of the present disclosure is directed to providing a composite substrate. The composite substrate comprises a substrate, an insulation layer, a first silicon-containing layer, and a first epitaxial layer. The insulation layer is disposed on the substrate. The first silicon-containing layer is disposed on the insulation layer and comprises a plurality of group V atoms. The first epitaxial layer is disposed on the first silicon-containing layer and comprises a plurality of group III atoms. A distribution concentration of the plurality of group V atoms in the first silicon-containing layer increases as getting closer to the first epitaxial layer, and a distribution concentration of the plurality of group III atoms in the first epitaxial layer increases as getting closer to the first silicon-containing layer.

In some embodiments, the composite substrate further comprises a multi-layered epitaxial structure disposed on the first epitaxial layer and in direct contact with the first epitaxial layer.

In some embodiments, the composite substrate further comprises a stacked structure disposed on the first epitaxial layer. The stacked structure comprises a second silicon-containing layer and a second epitaxial layer. The second silicon-containing layer is disposed on the first epitaxial layer and comprises the plurality of group V atoms. The second epitaxial layer is disposed on the second silicon-containing layer and comprises the plurality of group III atoms. A distribution concentration of the plurality of group V atoms in the second silicon-containing layer increases as getting closer to the second epitaxial layer, and a distribution concentration of the plurality of group III atoms in the second epitaxial layer increases as getting closer to the second silicon-containing layer.

In some embodiments, the composite substrate further comprises a multiple stacked structure formed by stacking a plurality of stacked structures in sequence.

In some embodiments, the second silicon-containing layer and the second epitaxial layer of the multiple stacked structure are alternately arranged with each other.

In some embodiments, the first silicon-containing layer is a patterned structure.

One aspect of an embodiment of the present disclosure is directed to providing a method of manufacturing a composite substrate. The method comprises: providing a first silicon-containing layer comprising a plurality of group V atoms; performing a first heat treatment to the first silicon-containing layer; providing a substrate having an insulation layer; disposing the first silicon-containing layer on the insulation layer; performing a thinning process on the first silicon-containing layer to obtain a thinned first silicon-containing layer comprising a first surface and a second surface opposite to the first surface, and the second surface being in direct contact with the insulation layer, in which a distribution concentration of the group V atoms from the second surface to the first surface gradually increases; and performing a first epitaxial process comprising simultaneously: forming a first epitaxial layer including a plurality of group III atoms on the thinned first silicon-containing layer; and performing a second heat treatment so that a distribution concentration of the plurality of group III atoms increases as getting closer to the thinned first silicon-containing layer to obtain a composite substrate.

In some embodiments, the method further comprises forming a multi-layered epitaxial structure that is in direct contact with and on the first epitaxial layer.

In some embodiments, the method further comprises disposing a stacked structure on the first epitaxial layer, in which the step of disposing the stacked structure on the first epitaxial layer includes: disposing a thinned second silicon-containing layer on the first epitaxial layer, in which the thinned second silicon-containing layer comprises an upper surface and a lower surface opposite to the upper surface, the lower surface is in direct contact with the first epitaxial layer, furthermore the thinned second silicon-containing layer includes the plurality of group V atoms, and a distribution concentration of the plurality of group V atoms in the thinned second silicon-containing layer increases from the lower surface to the upper surface; and performing a second epitaxial process comprising simultaneously: forming a second epitaxial layer including the plurality of group III atoms on the thinned second silicon-containing layer; and performing a third heat treatment so that a distribution concentration of the plurality of group III atoms increases as getting closer to the thinned second silicon-containing layer to obtain the composite substrate.

In some embodiments, the method further comprises disposing a plurality of stacked structures on the first epitaxial layer to form a multiple stacked structure.

In some embodiments, the method further comprises patterning the thinned first silicon-containing layer after performing the thinning process on the first silicon-containing layer.

In some embodiments, the method further comprises disposing a multi-layered epitaxial structure on the first epitaxial layer, in which the multi-layered epitaxial structure comprises a gallium nitride layer.

One aspect of an embodiment of the present disclosure is directed to a composite substrate, comprising: a first silicon-containing layer, comprising a plurality of group V atoms; and a first epitaxial layer disposed on the first silicon-containing layer, comprising a plurality of group III atoms, in which a distribution concentration of the plurality of group V atoms in the first silicon-containing layer increases as getting closer to the first epitaxial layer, and a distribution concentration of the plurality of group III atoms in the first epitaxial layer increases as getting closer to the first silicon-containing layer.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1A to FIG. 1H schematically depict schematic diagrams of manufacturing a composite substrate at various process stages according to some embodiments of the present disclosure.

DETAILED DESCRIPTION

Figure 1A:
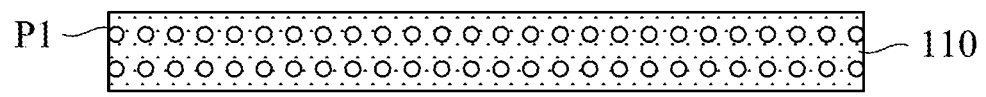

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. Any examples of the use of the term discussed herein included in the description of the present specification are merely for illustrative purposes, and are not intended to limit the scope and meaning of the present disclosure or any exemplary term. Similarly, the present disclosure is not limited to the various embodiments described in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," etc., may be used herein to describe various elements, these elements should not be limited by these terms. These terms are used to distinguish one element from another. For example, a first element could be termed a second element, and similarly, a second element could be termed a first element, without departing from the scope of the embodiments.

It will be understood that, as used herein, the phrase "and/or" includes any and all combinations of one or more of the associated listed items.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1H schematically depict schematic diagrams of manufacturing a composite substrate at various process stages according to some embodiments of the present disclosure.

A description is provided with reference to FIG. 1A. First, a first silicon-containing layer 110 is provided.

In some embodiments, the first silicon-containing layer 110 is a substrate with a low resistance value (resistance value<0.001 ohm-cm) and is doped with N-type dopants (group V atoms P1, which are negatively charged, for example, nitrogen atoms, phosphorus atoms, arsenic atoms, any other group V atoms, or a combination thereof). It can be understood that for a low-resistance substrate, its mechanical strength is generally higher than that of a high-resistance substrate. Hence, if it undergoes an epitaxial process, it is less likely to warp and crack, and a thicker multi-layered epitaxial structure (for example, a structure comprising high-frequency components, such as gallium nitride, etc.) can be grown and the cost is lower. However, a composite substrate that is formed by further depositing an epitaxial layer on the low-resistance substrate has the problem of carrier crosstalk effect. In one embodiment, the group V atoms P1 are uniformly distributed in an N-type substrate. In some embodiments, a lattice orientation of the first silicon-containing layer 110 comprises <111>, <100>, <110>, or a combination thereof. It is noted that if an aluminum nitride layer is continuously epitaxially formed on the first silicon-containing layer 110, the lattice orientation of the first silicon-containing layer 110 is <111>, which can achieve better lattice matching to avoid defects and improve stability and flatness of epitaxial growth. In some embodiments, a substrate of the first silicon-containing layer 110 comprises a silicon substrate, a semi-insulating SiC substrate, a semi-insulating GaO substrate, a silicon on insulator (SOI) substrate, a boron nitride (BN) substrate, or a combination thereof. In some embodiments, a thickness of the first silicon-containing layer 110 ranges from 100 micrometers (μm) to 1000 μm, for example, 100 μm, 200 μm, 300 μm, 400 μm, 500 μm, 600 μm, 700 μm, 800 μm, 900 μm, 1000 μm, or a value within any interval defined by the above values.

Figure 1B:
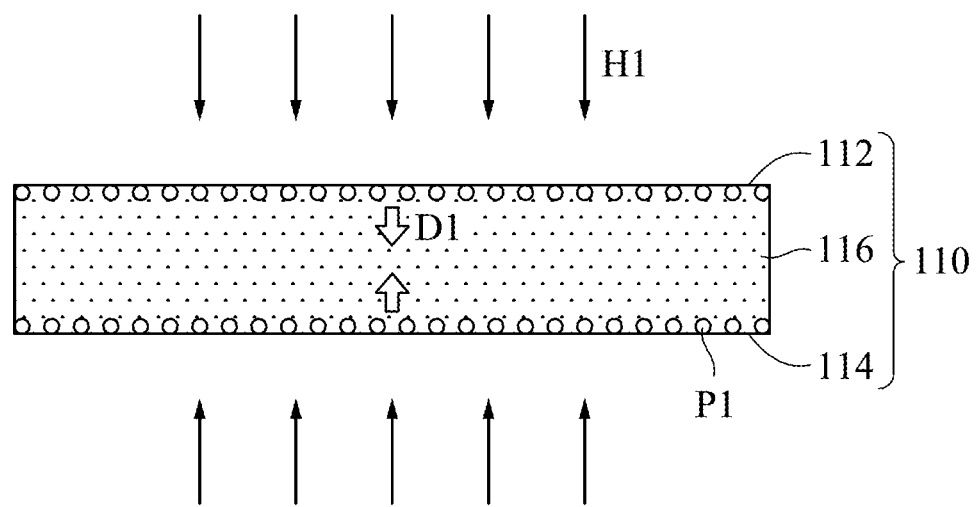
Figure 1C:
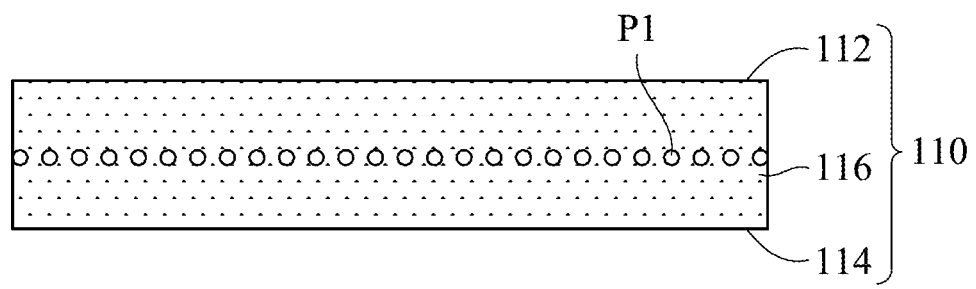

A description is provided with reference to FIG. 1B and FIG. 1C. Then, a first heat treatment H1 is performed on the first silicon-containing layer 110, so that a distribution concentration of the group V atoms P1 in the first silicon-containing layer 110 generates a gradient change.

In some embodiments, the first heat treatment H1 may comprise a rapid thermal process (RTP), furnace heating, some other suitable heating methods, or a combination thereof. For example, on upper and lower sides (for a surface 112 and a surface 114) of or around (not shown in the figure) the first silicon-containing layer 110, the first silicon-containing layer 110 is heated. During the first heat treatment H1, the group V atoms P1 (for example, on the surface 112 and the surface 114) will move in a direction D1 away from heat sources due to the out-gassing mechanism, so that distribution concentrations of the group V atoms in the first silicon-containing layer 110 generate the gradient change, and the distribution concentrations increase from the surface 112 and the surface 114 towards an inside 116 (see FIG. 1C). In some embodiments, a heating temperature of the first heat treatment H1 is from 600° C. to 1300° C., such as 600° C., 650° C., 700° C., 750° C., 800° C., 850° C., 900° C., 950° C., 1000° C., 1050° C., 1100° C., 1150° C., 1200° C., 1250° C., 1300° C., or a value within any interval defined by the above values. In some embodiments, a heating time is 5 seconds to 30 hours (such as 5 seconds, 10 seconds, 20 seconds, 30 seconds, 40 seconds, 50 seconds, 1 minute, 5 minutes, 10 minutes, 20 minutes, 40 minutes, 1 hour, 5 hours, 10 hours, 15 hours, 20 hours, 25 hours, 30 hours, or a value within any interval defined by the above values). In some embodiments, an initial concentration of the group V atoms P1 that have not been processed by the first heat treatment H1 (for example, a concentration of the surface 112 and the surface 114) is the same as or similar to a highest concentration of the group V atoms P1 that have been processed by the first heat treatment H1 (at the inside 116), for example, from $1 \times 10^{16}/cm^3$ to $1 \times 10^{17}/cm^3$.

Figure 1D:
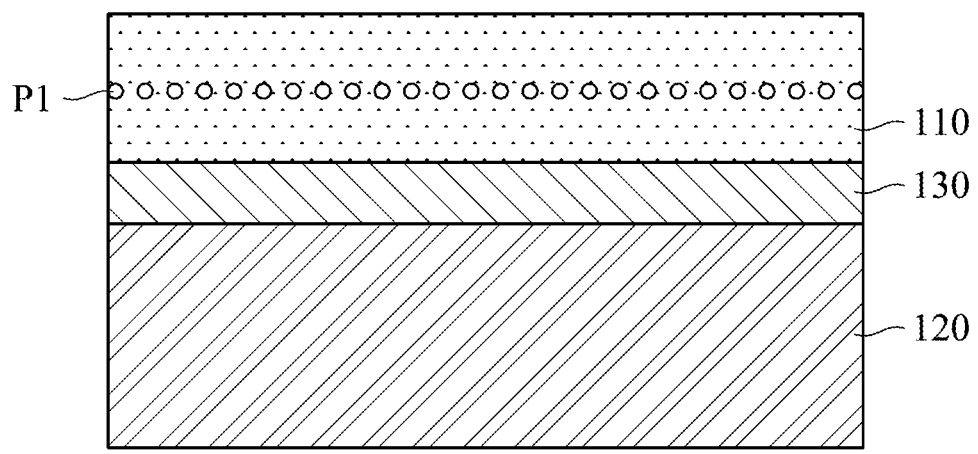

A description is provided with reference to FIG. 1D. After that, a substrate 120 and an insulation layer 130 are provided. The insulation layer 130 is disposed on the substrate 120. Next, the first silicon-containing layer 110 is disposed on the insulation layer 130.

In some embodiments, a material of the substrate 120 comprises a silicon substrate, a semi-insulating SiC substrate, a semi-insulating GaO substrate, a silicon on insulator (SOI) substrate, a boron nitride (BN) substrate, or a combination thereof. In some embodiments, the thickness of the first silicon-containing layer 110 ranges from 100 μm to 1000 μm, such as 100 μm, 200 μm, 300 μm, 400 μm 500 μm, 600 μm, 700 μm, 800 μm, 900 μm, 1000 μm, or a value within any interval defined by the above values. In some embodiments, a material of the insulation layer 130 comprises $SiO_2$, $Al_2O_3$, $Ga_2O_3$, SiN, TiN, BN, or a combination thereof. In some embodiments, the insulation layer 130 is a single-layered film. In some other embodiments, the insulation layer 130 may be a multi-layered film, for example, a double-layered film or a triple-layered film. When the insulation layer 130 is the double-layered film, a material of a first layer close to the substrate 120 comprises silicon dioxide ($SiO_2$), aluminum oxide ($Al_2O_3$), gallium oxide ($Ga_2O_3$), or a combination thereof, and a material of a second layer away from the substrate 120 comprises silicon nitride (SiN), titanium nitride (TiN), BN (boron nitride), or a combination thereof. When the insulation layer 130 has three or more layers, materials of two layers close to the substrate 120 and away from the substrate 120 are the same as or similar to those when the insulation layer 130 has double layers, and a material of an intermediate layer comprises silicon dioxide ($SiO_2$), aluminum oxide ($Al_2O_3$), gallium oxide ($Ga_2O_3$), silicon nitride (SiN), titanium nitride (TiN), BN (boron nitride), or a combination thereof. In some embodiments, a thickness of the insulation layer 130 is between 0.1 angstrom (Å) and 10000 Å, for example, from 1 Å to 100 Å (1 Å, 10 Å, 20 Å, 30 Å, 40 Å, 50 Å, 60 Å, 70 Å, 80 Å, 90 Å, 100 Å, or a value within any interval defined by the above values). In some embodiments, the insulation layer 130 may be disposed on the substrate 120 through high temperature furnace growth, chemical vapor deposition (CVD), physical vapor deposition (PVD), or a combination thereof.

In some embodiments, the step of disposing the first silicon-containing layer 110 on the insulation layer 130 may comprise bonding (for example, using hydrogen bonds) and heat treatment in sequence. After the heat treatment, water molecules will diffuse through oxides in the insulation layer 130 and reach to a silicon interface of the first silicon-containing layer 110, thus forming more oxides. As a result, bonds are formed between the first silicon-containing layer 110 and the insulation layer 130.

Figure 1E:
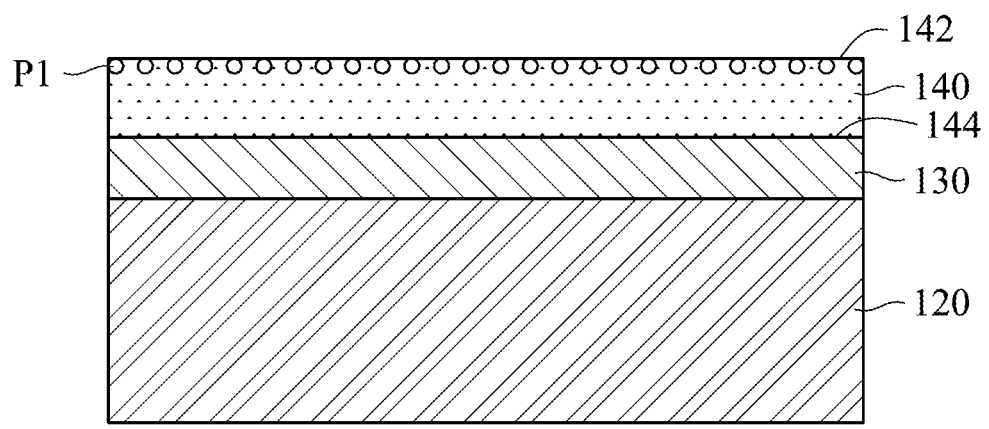

A description is provided with reference to FIG. 1E. Then, a thinning process is performed on the first silicon-containing layer 110 to form a thinned first silicon-containing layer 140. In some embodiments, chemical-mechanical polishing (CMP) or physical grinding may be used to thin the first silicon-containing layer 110 so as to obtain the thinned first silicon-containing layer 140. The thinned first silicon-containing layer 140 comprises a first surface 142 and a second surface 144 opposite to the first surface 142, and the second surface 144 is in direct contact with the insulation layer 130. The distribution concentration of the group V atoms P1 increases from the second surface 144 to the first surface 142, that is, the group V atoms P1 have a highest distribution concentration on the first surface 142. In some embodiments, a secondary ion mass spectrometer (SIMS) may be utilized to measure a doping concentration profile of the group V atoms P1 at different positions. In some embodiments, a thickness of the thinned first silicon-containing layer 140 ranges from 100 nanometers (nm) to 100 μm, for example, 100 nm, 500 nm, 1 μm, 10 μm, 20 μm, 30 μm, 40 μm, 50 μm, 60 μm, 70 μm, 80 μm, 90 μm, 100 μm, or a value within any interval defined by the above values. In some embodiments, in order to achieve the highest distribution concentration of the group V atoms P1 on the first surface 142 and a target thickness of the thinned first silicon-containing layer 140 after the thinning process, the first silicon-containing layer 110 can be selectively turned upside down depending on a distribution state of the group V atoms P1 after the first heat treatment H1, and then the first silicon-containing layer 110 is disposed on the insulation layer 130. In some other embodiments, it is possible that the first silicon-containing layer 110 may be chosen not to be turned upside down and directly disposed on the insulation layer 130.

Figure 1F:
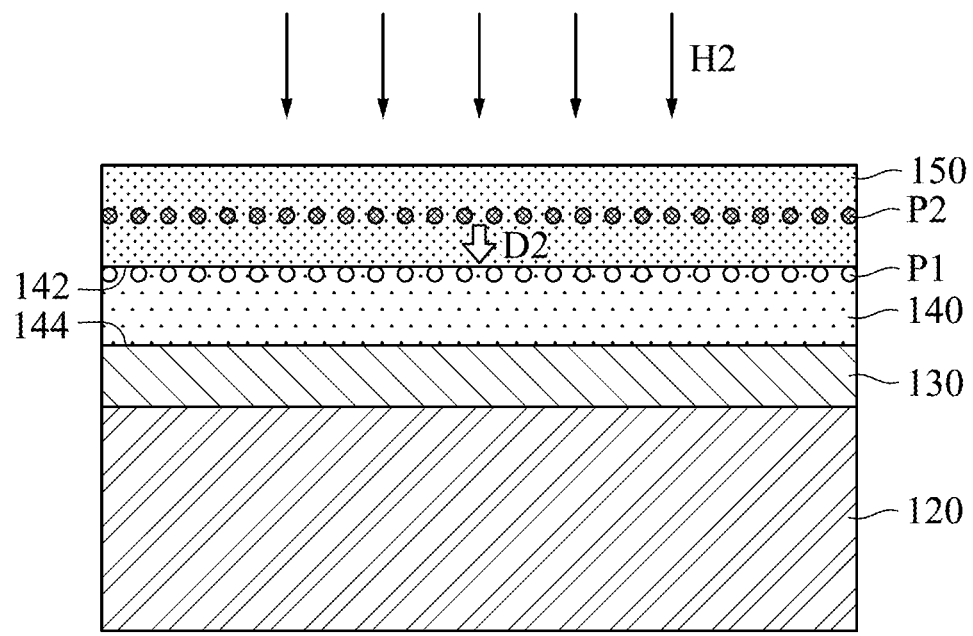
Figure 1G:
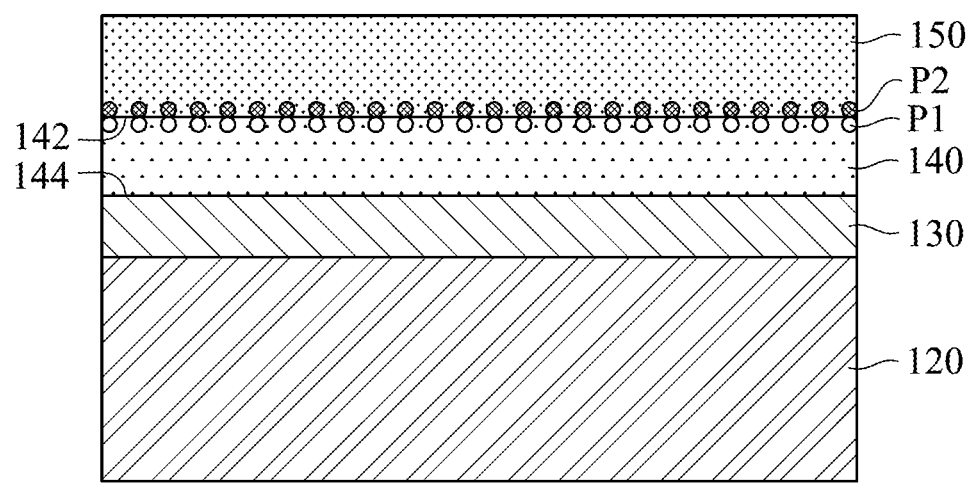

A description is provided with reference to FIG. 1F and FIG. 1G. After that, a first epitaxial process is performed, which comprises simultaneously: forming a first epitaxial layer 150 on the thinned first silicon-containing layer 140; and performing a second heat treatment H2 to obtain a composite substrate 100. In some embodiments, the first epitaxial layer 150 comprises a plurality of III group atoms (such as aluminum atoms, gallium atoms, indium atoms, any other group III atoms, or a combination thereof). In some embodiments, the first epitaxial layer 150 is aluminum nitride. It can be understood that, through the second heat treatment H2 of the first epitaxial process, heating from the upper side simultaneously can change a distribution concentration of the group III atoms P2 during the process of epitaxially forming the first epitaxial layer 150 in the first epitaxial process. As a result, the group III atoms P2 (P-type dopants, which are positively charged) diffuse downwards along a direction D2 to achieve a concentration gradient distribution consistent with or similar to that of the group V atoms P1 (negatively charged) of the thinned first silicon-containing layer 140 (for example, a distribution concentration of the group III atoms P2 decreases as getting away from an interface between the thinned first silicon-containing layer 140 and the first epitaxial layer 150, and increases as getting closer to the thinned first silicon-containing layer 140). Additionally, through the compensation mechanism of electron-hole recombination (principle of P-N junction or Heterojunction), a depletion region is formed to increase the resistance value. In some embodiments, a resistance value of the composite substrate 100 is higher than 1000 ohm-cm.

It is noted that the above consistent or similar concentration gradient distribution can be calculated according to Fick's Second Law (the diffusion flux and concentration gradient at a specific point in the system change with time, thus resulting in the non-steady state diffusion of the net accumulation or net loss of the diffusing material) and the Arrhenius equation (the relationship between the mass diffusivity, the rate constant of the chemical reaction and the temperature). That is to say, the ideal diffusion concentration gradient of the group V atoms P1 can be achieved through controlling a doping concentration of the group V atoms P1 in the first silicon-containing layer 110, a temperature and time of the first heat treatment H1, and a position to which the thinning process is performed based on the desired recombination compensation of the group V atoms P1 and the group III atoms P2. At the same time, through adjusting a temperature and time of the second heat treatment H2, the diffusion concentration gradient of the group III atoms P2 in the first epitaxial layer 150 can be achieved.

In some embodiments, the first epitaxial process uses a metal organic chemical vapor deposition (MOCVD). First, a first nucleation layer (such as aluminum nitride) having a thickness of 5 nm to 30 nm is grown at a lower temperature (800° C. to 1000° C., such as 800° C., 850° C., 900° C., 950° C., 1000° C., or a value within any interval defined by the above values). Then, a second nucleation layer (such as aluminum nitride) having a thickness of 15 nm to 250 nm is grown at a higher temperature (900° C. to 1100° C., such as 900° C., 950° C., 1000° C., 1050° C., 1100° C., or a value within any interval defined by the above values) to form the first epitaxial layer 150. The group III atoms P2 in the first epitaxial layer 150 formed by the above method can achieve a more consistent concentration gradient distribution as the group V atoms P1 in the thinned first silicon-containing layer 140 prepared by the first heat treatment H1 with the temperature of 1100° C. to 1250° C. and the thinning process. As a result, the composite substrate 100 having a higher resistant value (a larger depletion region range) is obtained. In some embodiments, the substrate 120 and the insulation layer 130 can further be removed, and only the first epitaxial layer 150 and the thinned first silicon-containing layer 140 are remained in a resultant composite substrate. In some other embodiments, the resultant composite substrate including only the first epitaxial layer 150 and the thinned first silicon-containing layer 140 can be manufactured by performing the steps similar to FIG. 1A to FIG. 1G without the addition of the substrate 120 and insulation layer 130.

Figure 1H:
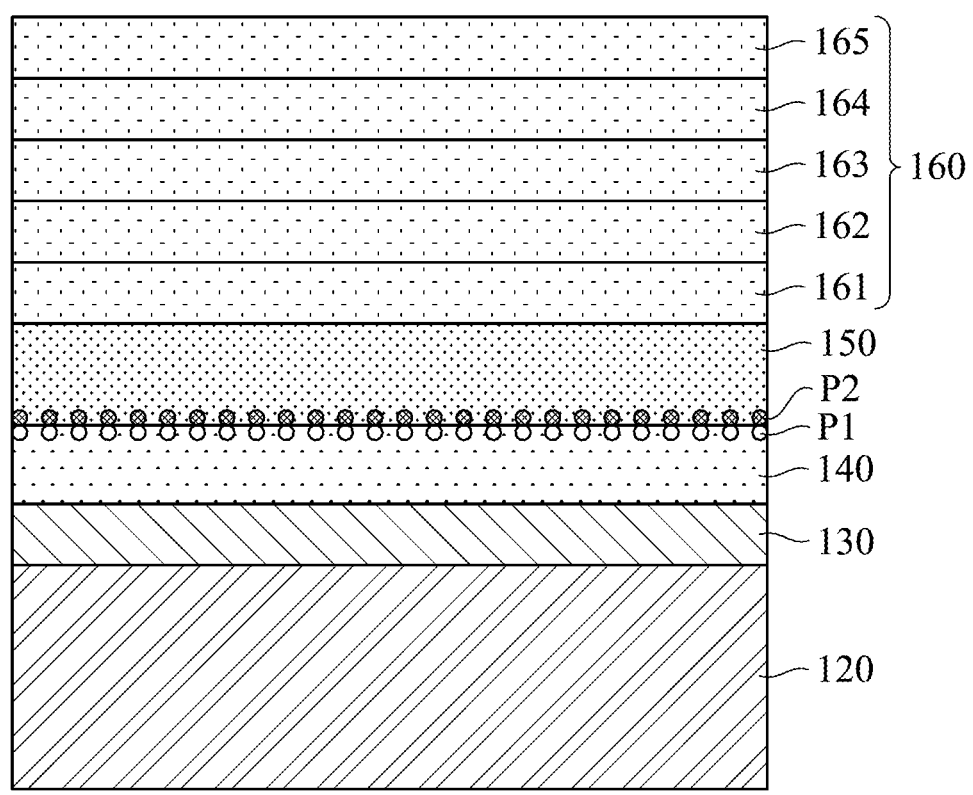

A description is provided with reference to FIG. 1H. After that, a multi-layered epitaxial structure 160 is disposed on the first epitaxial layer 150. The multi-layered epitaxial structure 160 directly contacts the first epitaxial layer 150. In some embodiments, the multi-layered epitaxial structure 160 comprises a high-frequency component, such as a gallium nitride layer. It is noted that the carrier crosstalk effect can be reduced when disposing the high-frequency component on the high-resistance composite substrate 100 as compared with disposing the high-frequency component on a low-resistance composite substrate in the related art. In addition to that, the advantages of high mechanical strength (not easy to warp and crack in the subsequent epitaxial process) and lower cost of the low-resistance composite substrate in the related art are retained.

In some embodiments, the multi-layered epitaxial structure 160 comprises a buffer layer 161, an impedance layer 162, a channel layer 163, a barrier layer 164, and a capping layer 165, which can be formed by MOCVD. In some embodiments, the buffer layer 161 comprises P-type $Al_aGa_{1-a}N$. The P-type $Al_aGa_{1-a}N$ may be doped with carbon, iron, magnesium, or a combination thereof, and its thickness is between 50 nm and 1000 nm. In some embodiments, the impedance layer 162 is aluminum gallium nitride, its thickness may be, for example, 200 nm, and may be doped with carbon, iron, or magnesium. For example, a doping concentration of carbon is $1\times10^{16}/cm^3$ to $1\times10^{21}/cm^3$. A doping concentration of iron or magnesium is $1\times10^{16}/cm^3$ to $1\times10^{20}/cm^3$.

In some embodiments, the channel layer 163 is gallium nitride, and its thickness is between 50 nm and 800 nm. In some embodiments, the barrier layer 164 comprises $In_xAl_yGa_{1-y}N$, where $0<x<1$, $0<y\leq1$, and its thickness is between 8 nm and 30 nm. In some embodiments, the capping layer 165 is P-type gallium nitride or P-type $Al_zGa_{1-z}N$, where $0.1\leq z\leq 0.2$. When the capping layer 165 is the P-type gallium nitride, its thickness is 1 nm to 20 nm. When the capping layer 165 is the P-type $Al_zGa_{1-z}N$, it may be doped with magnesium, and its thickness is 0.8 nm to 20 nm.

It is noted that an area of the depletion region can be flexibly increased, such as increasing a number of repeated stacks of the thinned first silicon-containing layer 140 and the first epitaxial layer 150, or increasing the area of the depletion region. For example, by using a method, such as increasing a contact area between the thinned first silicon-containing layer 140 and the first epitaxial layer 150, the area of the depletion region is increased to further increase the resistance value of the composite substrate 100. A detailed description may be referred to FIG. 2 and FIG. 3.

Figure 2:
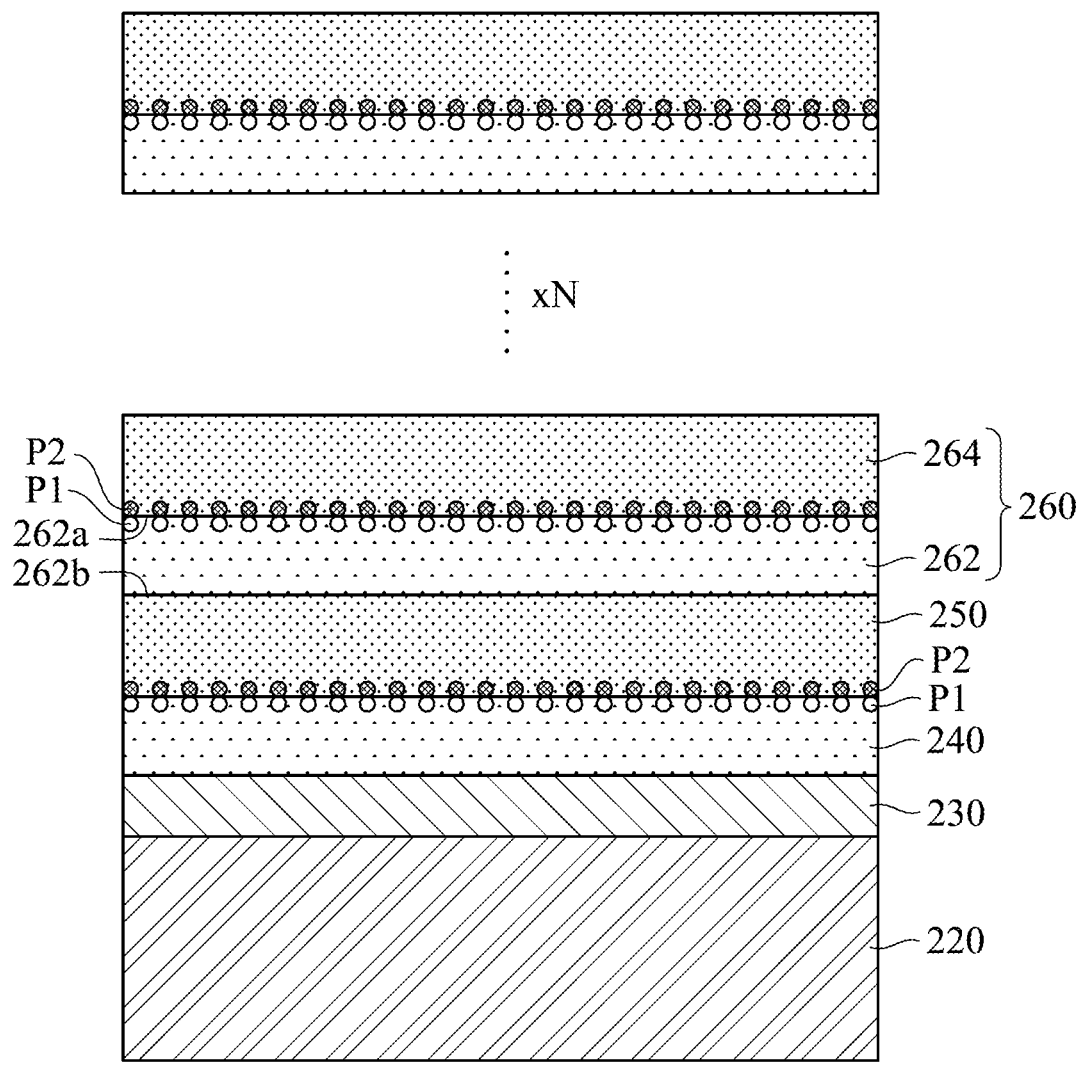
FIG. 2 schematically depicts a schematic cross-sectional diagram of a composite substrate according to some other embodiments of the present disclosure.

FIG. 2 schematically depicts a schematic cross-sectional diagram of a composite substrate according to some other embodiments of the present disclosure.

Materials (such as a substrate 220, an insulation layer 230, a thinned first silicon-containing layer 240, a first epitaxial layer 250) and steps of FIG. 2 are approximately similar to FIG. 1A to FIG. 1G. A difference lies in that in FIG. 2 one or a plurality of stacked structures 260 stacked in sequence are further disposed on the first epitaxial layer 250 ($1\leq N\leq 20$, where there are the plurality of stacked structures 260, that is, when 2≤N≤20, it can also be collectively called multiple stacked structure) after the first epitaxial layer 250 is formed. Then, the method similar to the method in FIG. 1H is used to dispose a multi-layered epitaxial structure (not shown in the figure) on the stacked structure(s) 260.

In some embodiments, the stacked structure 260 comprises a thinned second silicon-containing layer 262 and a second epitaxial layer 264. Since materials and disposition methods of the thinned second silicon-containing layer 262 and the second epitaxial layer 264 are the same as or similar to those of the thinned first silicon-containing layer 140 and the first epitaxial layer 150 in FIG. 1G (for example, a second epitaxial process that forms the second epitaxial layer 264 is the same as the first epitaxial process that forms the first epitaxial layer), a description in this regard is not provided. It is noted that, in the stacked structure 260, a distribution concentration of the group V atoms P1 in the thinned second silicon-containing layer 262 increases as getting closer to the second epitaxial layer 264 of a same group if the thinned second silicon-containing layer 262 and the second epitaxial layer 264 disposed on the thinned second silicon-containing layer 262 are regarded as one group (for example, it increases from a lower surface 262b to the upper surface 262a), and a distribution concentration of the group III atoms P2 in the second epitaxial layer 264 increases as getting closer to the thinned second silicon-containing layer 262 of the same group. In some embodiments, when a number of the stacked structure 260 in FIG. 2 is 1 (N=1), the thinned second silicon-containing layer 262 is disposed on the first epitaxial layer 250 and is in direct contact with the first epitaxial layer 250 and the second epitaxial layer 264. When a number of the stacked structures 260 in FIG. 2 is a plural number (N≥2), the thinned second silicon-containing layer 262 of a first group of the stacked structures 260 is disposed on the first epitaxial layer 250 and is in direct contact with the first epitaxial layer 250 and the second epitaxial layer 264 of the same group. The thinned second silicon-containing layer 262 of each of a second to an Nth group of the stacked structures 260 (on the first group of the stacked structures 260) is disposed on the second epitaxial layer 264 of a previous group of the stacked structures 260, and is in direct contact with the second epitaxial layers 264 of the previous group and the same group. Therefore, the thinned second silicon-containing layer 262 is located between the second epitaxial layers 264. That is to say, the thinned second silicon-containing layers 262 and the second epitaxial layers 264 of the stacked structure 260 neighboring to another stacked structure 260 are alternately arranged with each other.

Through the disposition of the stacked structures 260, a number of P-N junctions can be increased to increase an area of the depletion region. As compared with the composite substrate 100 (please refer to FIG. 1G), a resistance value of a composite substrate 200 can be further increased, and the composite substrate 200 having a specific resistance value can be obtained through adjusting a specific number of the stacked structures 260, thus improving the application flexibility of the composite substrate.

Figure 3:
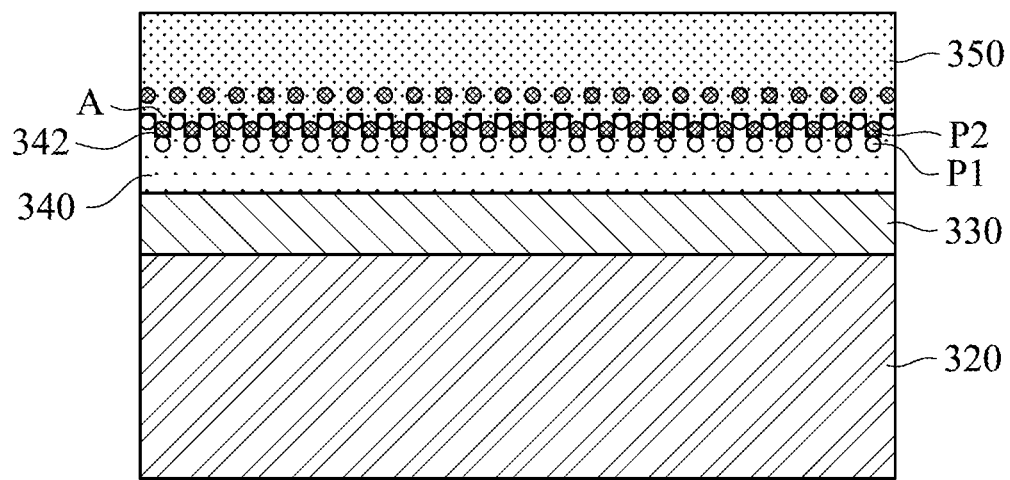
FIG. 3 schematically depicts a schematic cross-sectional diagram of a composite substrate according to still some other embodiments of the present disclosure.

FIG. 3 schematically depicts a schematic cross-sectional diagram of a composite substrate according to still some other embodiments of the present disclosure.

Materials (such as a substrate 320, an insulation layer 330, a thinned first silicon-containing layer 340, a first epitaxial layer 350) and steps of FIG. 3 are approximately similar to FIG. 1A to FIG. 1G. A difference lies in that in FIG. 3 the thinned first silicon-containing layer 340 is further patterned to form a patterned structure having a plurality of grooves A on a first surface 342 after a thinning process is performed on the first silicon-containing layer (not shown in the figure) to form the thinned first silicon-containing layer 340. Then, a first epitaxial process is performed to form the first epitaxial layer 350 on the thinned first silicon-containing layer 340. That is, the thinned first silicon-containing layer 340 is obtained by thinning and then patterning the first silicon-containing layer.

By patterning the thinned first silicon-containing layer 340, a contact area between the thinned first silicon-containing layer 340 and the first epitaxial layer 350 can be increased to increase an area of a depletion region. As compared with the composite substrate 100 (please refer to FIG. 1G), a resistance value of a composite substrate 300 can be further increased. Additionally, different widths, densities, or shapes of the grooves A can be designed depending on the needs, so that different contact areas can be adjusted to obtain the composite substrate 300 having a specific resistance value, thus improving the application flexibility of the composite substrate.

In summary, in the composite substrate and the manufacturing method thereof according to some embodiments of the present disclosure, appropriate heating and thinning processes are performed on the first silicon-containing layer, and an appropriate heating treatment is performed on the first epitaxial layer to change the distributions of the group V atoms in the first silicon-containing layer and the group III atoms in the first epitaxial layer. As a result, the two reach a consistent or similar concentration distribution. Then, through the compensation mechanism of electron-hole recombination, the P-N junction(s) and the depletion region (s) are formed to increase the resistance value of the composite substrate. That is, by using some embodiments of the present disclosure, the low resistance value of the composite substrate can be changed to the high resistance value to reduce the carrier crosstalk effect, and at the same time the advantages of high mechanical strength (not easy to warp and crack in the subsequent epitaxial process) and lower cost, etc. of the low-resistance composite substrate can be retained.

Although the present invention has been described in considerable detail with reference to certain embodiments thereof, other embodiments are possible. Therefore, the spirit and scope of the appended claims should not be limited to the description of the embodiments contained herein.

What is claimed is:
1. A method of manufacturing a composite substrate, comprising:
    providing a first silicon-containing layer comprising a plurality of group V atoms;
    performing a first heat treatment to the first silicon-containing layer;
    providing a substrate having an insulation layer;
    disposing the first silicon-containing layer on the insulation layer;
    performing a thinning process on the first silicon-containing layer to obtain a thinned first silicon-containing layer comprising a first surface and a second surface opposite to the first surface, and the second surface being in direct contact with the insulation layer, wherein a distribution concentration of the plurality of group V atoms from the second surface to the first surface gradually increases; and
    performing a first epitaxial process comprising simultaneously:

forming a first epitaxial layer including a plurality of group III atoms on the thinned first silicon-containing layer; and performing a second heat treatment so that a distribution concentration of the plurality of group III atoms increases as getting closer to the thinned first silicon-containing layer to obtain a composite substrate.

2. The method of claim 1, further comprising forming a multi-layered epitaxial structure that is in direct contact with and on the first epitaxial layer.

3. The method of claim 1, further comprising disposing a stacked structure on the first epitaxial layer, wherein the step of disposing the stacked structure on the first epitaxial layer comprises:

disposing a thinned second silicon-containing layer on the first epitaxial layer, wherein the thinned second silicon-containing layer includes an upper surface and a lower surface opposite to the upper surface, the lower surface is in direct contact with the first epitaxial layer, furthermore the thinned second silicon-containing layer includes the plurality of group V atoms, and a distribution concentration of the plurality of group V atoms in the thinned second silicon-containing layer increases from the lower surface to the upper surface; and performing a second epitaxial process comprising simultaneously:

forming a second epitaxial layer including the plurality of group III atoms on the thinned second silicon-containing layer; and performing a third heat treatment so that a distribution concentration of the plurality of group III atoms increases as getting closer to the thinned second silicon-containing layer to obtain the composite substrate.

4. The method of claim 3, further comprising disposing a plurality of stacked structures on the first epitaxial layer to form a multiple stacked structure.

5. The method of claim 4, wherein the second silicon-containing layer and the second epitaxial layer of the multiple stacked structure are alternately arranged with each other.

6. The method of claim 3, wherein the method further comprises patterning the thinned first silicon-containing layer after performing the thinning process on the first silicon-containing layer.

* * * * *